(12) United States Patent
Nakamura et al.

(10) Patent No.: US 6,399,965 B2
(45) Date of Patent: Jun. 4, 2002

(54) SEMICONDUCTOR LIGHT EMITTING DEVICE WITH HIGH YIELD AND LOW POWER CONSUMPTION

(75) Inventors: Junichi Nakamura, Kashiba; Kazuaki Sasaki, Osaka; Shouichi Ohyama, Ikoma-gun, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/757,689

(22) Filed: Jan. 11, 2001

(30) Foreign Application Priority Data

Jan. 11, 2000 (JP) .......................... 2000-002629
Oct. 27, 2000 (JP) .......................... 2000-328480

(51) Int. Cl.[7] .......................................... H01L 33/00
(52) U.S. Cl. .................. 257/103; 257/96; 257/97; 257/190; 257/191
(58) Field of Search ................. 257/97, 101, 103, 257/86; 372/46

(56) References Cited

U.S. PATENT DOCUMENTS 5,619,519 A * 4/1997 Hamada et al. ................ 372/46
5,786,603 A * 7/1998 Rennie et al. ................ 257/13
6,107,648 A * 8/2000 Shakuda et al. ............ 257/103

FOREIGN PATENT DOCUMENTS

| JP | 62-200786 | 9/1987 | ............ H01S/3/18 |
| JP | 1-184972 | 7/1989 | ............ H01S/3/18 |
| JP | 5-275740 | 10/1993 | ............ H01L/33/00 |
| JP | 6-85385 | 3/1994 | ............ H01S/3/18 |
| JP | 6-164057 | 6/1994 | ............ H01S/3/18 |
| JP | 9-260724 | 10/1997 | ............ H01L/33/00 |

\* cited by examiner

*Primary Examiner*—David Nelms
*Assistant Examiner*—Tu-Tu Ho
(74) *Attorney, Agent, or Firm*—Nixon & Vanderhye P. C.

(57) ABSTRACT

There is provided a semiconductor light emitting device having improved adhesion of an electrode by reducing defects in a crystal surface. An n-type AlGaInP lower clad layer 12, an AlGaInP active layer 13, a p-type AlGaInP upper clad layer 14, a p-type AlGaInP intermediate layer 15 whose lattice matching rate $\Delta a/a$ with GaAs is −3.3%, a p-type AlGaInP current diffusion layer 16 and a p-type electrode 17 are laminated on an n-type GaAs substrate 11 and an n-type electrode 18 is provided on the n-type GaAs substrate 11. Thus, the number of crystal defects in the crystal surface can be reduced to 20 or less per one LED by setting the value of the lattice matching rate $\Delta a/a$ of the intermediate layer 15 to be −3.3%, which is lower than −2.5%. As a result, adhesion of the p-type electrode 17 formed on the current diffusion layer 16 is improved and thereby the yield of LED can be enhanced.

19 Claims, 10 Drawing Sheets

SEMICONDUCTOR LIGHT EMITTING DEVICE WITH HIGH YIELD AND LOW POWER CONSUMPTION

BACKGROUND OF THE INVENTION

The present invention relates to a semiconductor light emitting device. More particularly, the invention relates to a semiconductor light emitting device using AlGaInP compound semiconductor material.

AlGaInP compound semiconductor is used as material for a device emitting light in a 0.5–0.6 μm wavelength band. In particular, a light emitting diode (LED) which uses GaAs as a substrate and has a light emitting section composed of AlGaInP material which is lattice-matched with GaAs is capable of emitting high-intensity light in a wavelength range from red to green with lower power than a conventional one using indirect transition semiconductor material such as GaP, GaAsP or the like.

To achieve high brightness light emitting with low power consumption, it is important that light emitting efficiency in a light emitting section is improved and that efficiency of taking out light from the light emitting section is also improved. It is also important that an operating voltage is lowered.

Figure 16:
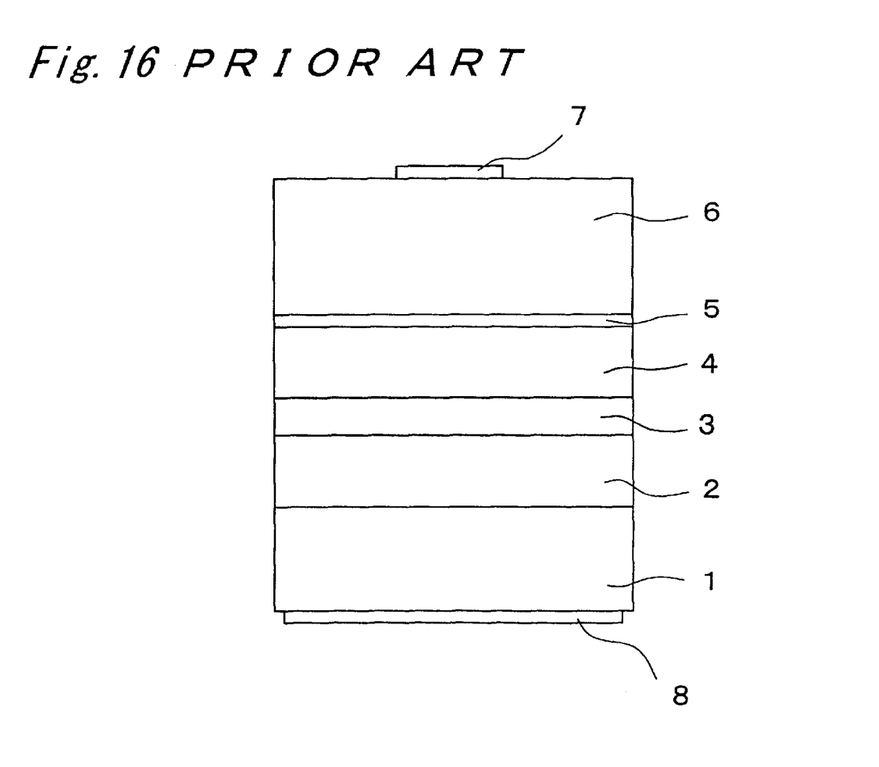
FIG. 16 is a cross sectional view showing a structure of a conventional LED having a current diffusion layer and an intermediate layer.

FIG. 16 is a cross sectional view showing a LED having a conventional current diffusion layer and an intermediate layer (Japanese Patent Laid-Open Publication No. 9-260724). This LED has an n-type AlGaInP lower clad layer 2, an AlGaInP active layer 3 and a p-type AlGaInP upper clad layer 4 successively laminated on an n-type GaAs substrate 1. Then, on top of these layers, a p-type AlGaInP intermediate layer 5 and a p-type GaP current diffusion layer 6 are successively laminated. Further, a p-type electrode 7 and an n-type electrode 8 are formed by deposition.

A composition of the p-type AlGaInP intermediate layer 5 is selected such that its lattice matching rate Δa/a is a median value of those of the p-type AlGaInP upper clad layer 4 and the p-type GaP current diffusion layer 6 and that the lower edge of its conduction band is between the lower edge of the conduction band in the upper clad layer 4 and that of the conduction band in the current diffusion layer 6 and the upper edge of its valence band is between the upper edge of the valence band in the upper clad layer 4 and that of the valence band of the current diffusion layer 6 in energy levels before junctions are formed so that heterobarriers are lowered in an energy band profile.

Figure 17:
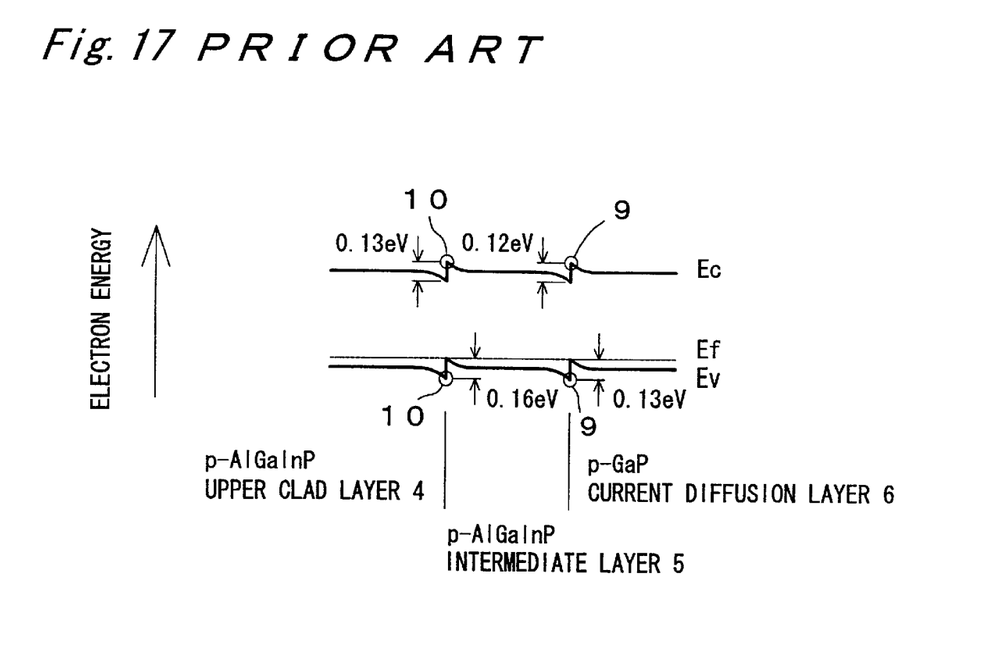
FIG. 17 shows an energy band profile from an upper clad layer to a current diffusion layer in the LED shown in FIG. 16.
Figure 18:
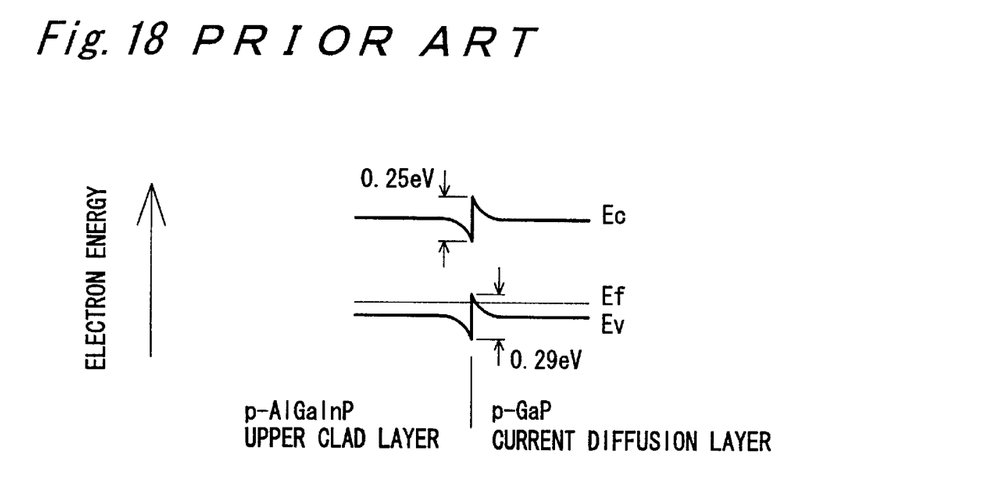
FIG. 18 shows an energy band profile in an LED having no intermediate layer.

Since the conventional LED has the p-type GaP current diffusion layer 6, current can be injected not only into a region directly below the electrode 7, but all over the active layer 3. FIG. 17 shows an energy band profile from the upper clad layer 4 to the current diffusion layer 6 in the conventional LED. Since this LED has the p-type AlGaInP intermediate layer 5 between the upper clad layer 4 and the current diffusion layer 6, energy discontinuity level can be divided and decreased as compared with an energy band profile when an intermediate layer is not used shown in FIG. 18. Therefore, heterobarriers 9, 10 referred to as "notches" occurring at the p-type AlGaInP upper clad layer 4 interface and the p-type GaP current diffusion layer 6 interface can be lowered.

Further, in the conventional LED, a lattice constant of the p-type AlGaInP upper clad layer 4 is 5.65 Å and a lattice constant of the p-type GaP current diffusion layer 6 is 5.45 Å. The composition of the p-type AlGaInP intermediate layer 5 is selected such that its lattice constant is 5.55 Å, which is a median value of the aforementioned constants, and thereby lattice mismatch is relieved. Consequently, interface levels occurring at the upper clad layer 4 interface and the current diffusion layer 6 interface can be lowered and the degree of bending in the energy band profile occurring due to the interface levels can be reduced. Therefore, the energy barrier of the interface can be lowered as shown in FIG. 17.

Thus, the operating voltage of this conventional LED can be substantially reduced by the above-described effect of lowering the energy barrier.

However, this conventional LED has problems described below. That is, as described above, the reduction of the operating voltage is achieved by selecting a composition in which the lower edge of the conduction band of the p-type AlGaInP intermediate layer 5 and the upper edge of its valence band are between those of the upper clad layer 4 and the current diffusion layer 6 in the energy level relationship before their junctions are formed. Further, the interface levels are lowered by setting the lattice constant of the intermediate layer 5 to be a median value of those of the upper clad layer 4 and the current diffusion layer 6 and thereby further reduction of operating voltage is achieved.

However, an experiment reveals that an effect of reducing the operating voltage and an effect of reducing crystal defects in the crystal surface are not sufficiently obtained depending on the lattice matching rate Δa/a of the p-type AlGaInP intermediate layer 5 with the GaAs substrate 1.

When the effect of reducing the operating voltage and the effect of reducing crystal defects are not sufficiently obtained, current spread and light transmittance in the current diffusion layer 6 are deteriorated. The light taking out efficiency and the current injection efficiency are also deteriorated. Consequently, sufficient brightness cannot be obtained. Another problem is that power consumption is not sufficiently low since the operating voltage is not sufficiently reduced. Further, there is an adverse effect that adhesion of the electrode 7 formed on the current diffusion layer 6 is degraded due to crystal defects in the crystal surface and thereby the electrode 7 peels. Thus, productivity is decreased because the yield is lowered.

SUMMARY OF THE INVENTION

Accordingly, an object of the present invention is to provide a low-priced semiconductor light emitting device with high brightness intensity and low power consumption by reducing operating voltage to reduce power consumption and reducing defects in the crystal surface to improve adhesion of an electrode so as to improve the yield.

To achieve the above object, the present invention provides a semiconductor light emitting device comprising:
 a compound semiconductor substrate;
 a laminated structure provided on the compound semiconductor substrate and including at least an active layer for emitting light, a first clad layer and a second clad layer sandwiching the active layer from both sides thereof;
 an intermediate layer formed on the laminated structure;
 a current diffusion layer formed on the intermediate layer;
 at least one of a structure for enhancing a yield by improving adhesion of an electrode and a structure for reducing power consumption by reducing an operating voltage.

In one embodiment, a value of a lattice matching rate Δa/a of the intermediate layer with the compound semiconductor substrate is set such that the number of crystal defects observed in a crystal surface is 20 or less after crystal growth finishes.

According to the above embodiment, the number of crystal defects in the crystal surface is reduced to 20 or less after crystal growth finishes. Consequently, adhesion of an electrode formed on the crystal surface is improved and thereby the yield is enhanced. That is, a high brightness intensity semiconductor light emitting device can be provided at a low cost.

In one embodiment, a value of a lattice matching rate $\Delta a/a$ of the intermediate layer with the compound semiconductor substrate is set such that an operating voltage increase when a driving current is 20 mA is 0.5 V or lower at interfaces in the intermediate layer.

According to the above embodiment, an operating voltage rise at interfaces in the intermediate layer when the driving current is 20 mA is suppressed to 0.5 V or lower. Thus, the operating voltage is reduced and thereby power consumption is reduced. That is, a high brightness semiconductor light emitting device with low power consumption can be provided.

In one embodiment, a value of a lattice matching rate $\Delta a/a$ of the intermediate layer with the compound semiconductor substrate is set such that the number of crystal defects observed in a crystal surface is 20 or less after crystal growth finishes and that an operating voltage increase when a driving current is 20 mA is 0.5 V or lower at interfaces in the intermediate layer.

According to the above embodiment, the number of crystal defects in the crystal surface is reduced to 20 or less after crystal growth finishes. Consequently, adhesion of an electrodes formed on the crystal surface is improved and thereby the yield is improved. Further, an operating voltage rise at interfaces in the intermediate layer when the driving current is 20 mA is suppressed to 0.5 V or lower. Thus, the operating voltage is reduced and thereby power consumption is reduced. That is, a high brightness intensity semiconductor light emitting device with low power consumption can be provided at a low cost.

In one embodiment, the compound semiconductor substrate is constituted by GaAs, the active layer, the first clad layer and the second clad layer are constituted by AlGaInP compound semiconductor of which an absolute value of a lattice matching rate $\Delta a/a$ with GaAs is 0.25% or lower, the current diffusion layer is constituted by AlGaInP compound semiconductor or GaP compound semiconductor of which an absolute value of a lattice matching rate $\Delta a/a$ with GaP is 0.25% or lower, and the intermediate layer is constituted by AlGaInP compound semiconductor whose lattice matching rate $\Delta a/a$ with GaAs is -2.5% or lower.

According to the above embodiment, since the lattice matching rate $\Delta a/a$ of the intermediate layer with the GaAs compound semiconductor substrate in the AlGaInP semiconductor light emitting device is -2.5% or lower, the number of crystal defects in the crystal surface is reduced to 20 or less after crystal growth finishes. Therefore, adhesion of an electrode formed on the crystal surface is improved and thereby the yield is enhanced.

In one embodiment, the compound semiconductor substrate is constituted by GaAs, the active layer, the first clad layer and the second clad layer are constituted by AlGaInP compound semiconductor of which an absolute value of a lattice matching rate $\Delta a/a$ with GaAs is 0.25% or lower, the current diffusion layer is constituted by AlGaInP compound semiconductor or GaP compound semiconductor of which an absolute value of a lattice matching rate $\Delta a/a$ with GaP is 0.25% or lower, and the intermediate layer is constituted by AlGaInP compound semiconductor whose lattice matching rate $\Delta a/a$ with GaAs is -3.2% or higher.

According to the above embodiment, since the lattice matching rate $\Delta a/a$ of the intermediate layer with the GaAs compound semiconductor substrate in the AlGaInP semiconductor light emitting device is -3.2% or higher, an operating voltage rise at interfaces in the intermediate layer when the driving current is 20 mA is suppressed to 0.5 V or lower. Thus, the operating voltage is reduced and thereby power consumption is reduced.

In one embodiment, the compound semiconductor substrate is constituted by GaAs, the active layer, the first clad layer and the second clad layer are constituted by AlGaInP compound semiconductor of which an the absolute value of a lattice matching rate $\Delta a/a$ with GaAs is 0.25% or lower, the current diffusion layer is constituted by AlGaInP compound semiconductor or GaP compound semiconductor of which an absolute value of a lattice matching rate $\Delta a/a$ with GaP is 0.25% or lower, and the intermediate layer is constituted by AlGaInP compound semiconductor whose lattice matching rate $\Delta a/a$ with GaAs is between -3.2% and -2.5% inclusive.

According to the above embodiment, since the lattice matching rate $\Delta a/a$ of the intermediate layer with the GaAs compound semiconductor substrate in the AlGaInP semiconductor light emitting device is -2.5% or lower, the number of crystal defects in the crystal surface is reduced to 20 or less after crystal growth finishes. Further, since the lattice matching rate $\Delta a/a$ of the intermediate layer with the GaAs compound semiconductor substrate in the AlGaInP semiconductor light emitting device is -3.2% or higher, an operating voltage rise at interfaces in the intermediate layer when the driving current is 20 mA is suppressed to 0.5 V or lower. Thus, adhesion of the electrode is improved and thereby the yield is enhanced. Also, the operating voltage is reduced and thereby power consumption is reduced.

In one embodiment, the compound semiconductor substrate is constituted by GaAs, the active layer, the first clad layer and the second clad layer is constituted by AlGaInP compound semiconductor which is lattice-matched with GaAs, the current diffusion layer is constituted by AlGaInP compound semiconductor or GaP compound semiconductor, and the intermediate layer is constituted by AlGaInP compound semiconductor.

According to the above embodiment, there is provided the AlGaInP semiconductor light emitting device having the intermediate layer composed of AlGaInP compound semiconductor, wherein at least either adhesion of an electrode is improved and thereby the yield is improved or operating voltage is reduced and thereby power consumption is reduced.

In one embodiment, the compound semiconductor substrate is constituted by GaAs, the active layer, the first clad layer and the second clad layer is constituted by AlGaInP compound semiconductor which is lattice-matched with GaAs, the current diffusion layer is constituted by AlGaInP compound semiconductor or GaP compound semiconductor, and the intermediate layer is constituted by AlGaAsP compound semiconductor.

According to the above embodiment, there is provided the AlGaInP semiconductor light emitting device having the intermediate layer composed of AlGaAsP compound semiconductor, wherein at least either adhesion of an electrode is improved and thereby the yield is improved or operating voltage is reduced and thereby power consumption is reduced.

In one embodiment, the intermediate layer is comprised of a plurality of layers.

According to the above embodiment, since the intermediate layer is comprised of plural layers, notches occurring at interfaces between the respective layers in the intermediate layer and layers brought in contact with the outside of the intermediate layer are lowered. Therefore, the operating voltage is further reduced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail below with reference to embodiments shown in drawing.

First Embodiment

Figure 1:
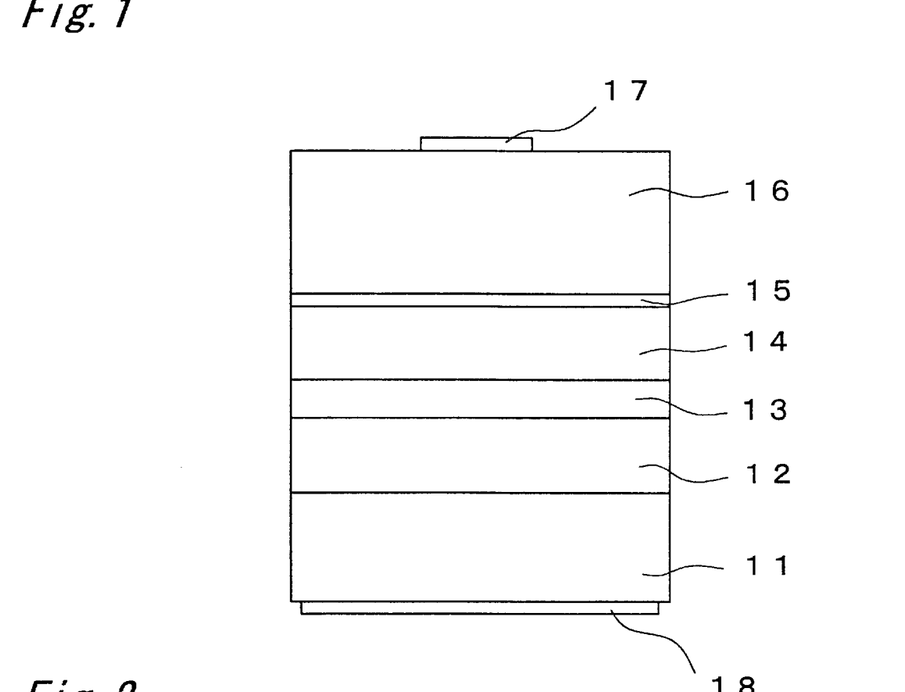
FIG. 1 is a cross sectional view showing a structure of an LED as a semiconductor light emitting device according to the present invention.

FIG. 1 is a cross sectional view showing a structure of an LED as a semiconductor light emitting device according to a first embodiment. This LED is obtained by successively growing an n-type $(Al_xGa_{1-x})_{0.51}In_{0.49}P$ $(0 \leq x \leq 1)$ lower clad layer 12 (for example, x=1.0, Si carrier density: $5 \times 10^{17}$ $cm^{-3}$, thickness: 1.0 μm), an $(Al_xGa_{1-x})_{0.51}In_{0.49}P$ $(0 \leq x \leq 1)$ active layer 13 (for example, x=0.3, thickness: 0.5 μm) and a p-type $(Al_xGa_{1-x})_{0.51}In_{0.49}P$ $(0 \leq x \leq 1)$ upper clad layer 14 (for example, x=1.0, Zn carrier density: $5 \times 10^{17}$ $cm^{-3}$, thickness: 1.0 μm) on an n-type GaAs substrate 11 at a growth rate of about 1–2.5 μm/h by the metal organic chemical vapor deposition (MOCVD) method. Further, on top of these layers, a p-type $(Al_xGa_{1-x})_yIn_{1-y}P$ $(0 \leq x \leq 1, 0 \leq y \leq 1)$ intermediate layer 15 (for example, x=0.4, y=0.97 (the lattice matching rate Δa/a with GaAs is about −3.3%), Zn carrier density: $1 \times 10^{18}$ $cm^{-3}$, thickness: 0.1 μm) and a p-type $(Al_xGa_{1-x})_yIn_{1-y}P$ $(0 \leq x \leq 1, 0 \leq y \leq 1)$ current diffusion layer 16 (for example, x=0.0, y=1.0, Zn carrier density $3 \times 10^{18}$ $cm^{-3}$, thickness 7.0 μm) are successively grown. It is noted that the above layers were grown at a growth temperature of about 730° C. Subsequently, a p-type electrode 17 (for example, Au—Zn) and an n-type electrode 18 (for example, Au—Ge) are formed by deposition. The p-type electrode 17 is processed, for example, into a circular shape. Thus, this LED is completed.

The absolute value of the lattice matching rate Δa/a of the active layer 13, the lower clad layer 12 and the upper clad layer 14 with GaAs is 0.25% or lower. The absolute value of the lattice matching rate Δa/a of the current diffusion layer 16 with GaP is 0.25% or lower.

Figure 2:
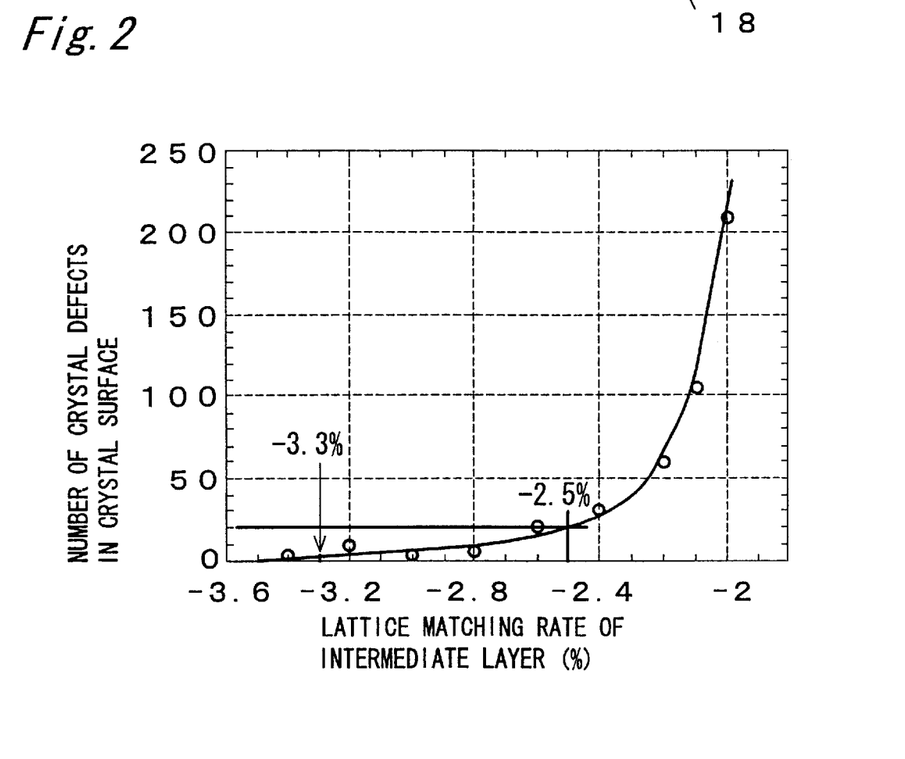
FIG. 2 shows the relationship between the lattice matching rate Δa/a of an intermediate layer in FIG. 1 with GaAs and the number of crystal defects in a crystal surface.
Figure 3:
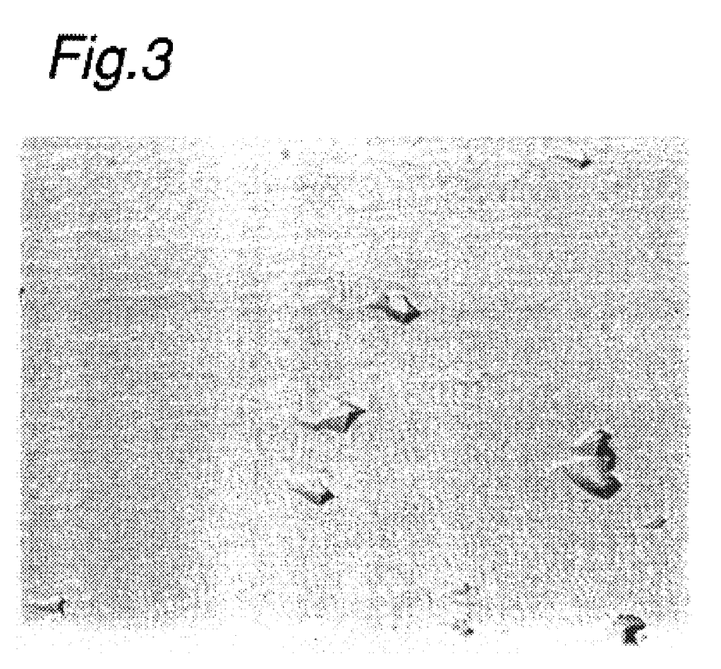
FIG. 3 is an illustration showing hillocks as crystal defects.

In this embodiment, an experiment was performed in advance to obtain the relationship between the crystal defects observed in the crystal surface and the lattice matching rate Δa/a of the intermediate layer with GaAs. In this experiment, the lattice matching rate Δa/a of the intermediate layer was controlled by changing the flow rate of TMGa, TMAl and TMIn, which are materials of Ga, Al and In, when the LED was fabricated by the above method. For each of lattice matching rates Δa/a of the intermediate layers, the number of crystal defects observed in the crystal surface was measured after crystal growth. The result is shown in FIG. 2. It is assumed that the crystal defects are hillocks (protruded defects) as shown in FIG. 3 or recessed defects and that their size is 0.5 μm or larger in diameter.

As shown in FIG. 2, the number of crystal defects observed in the crystal surface is 20 or less per one LED in a range where the value of the lattice matching rate Δa/a of the intermediate layer is −2.5% or lower.

In this embodiment, based on the experimental results, the value of the lattice matching rate Δa/a of the p-type $(Al_xGa_{1-x})_yIn_{1-y}P$ intermediate layer 15 is set to be −3.3%, which is in the range of −2.5% or lower. The number of crystal defects observed in the crystal surface can be made lower than that in a conventional LED where the value of lattice matching rate $\Delta a/a$ of the intermediate layer is not considered. As a result, adhesion of the p-type electrode 17 formed on the p-type $(Al_xGa_{1-x})_yIn_{1-y}P$ current diffusion layer 16 is improved and thereby the yield can be improved.

Second Embodiment

Figure 4:
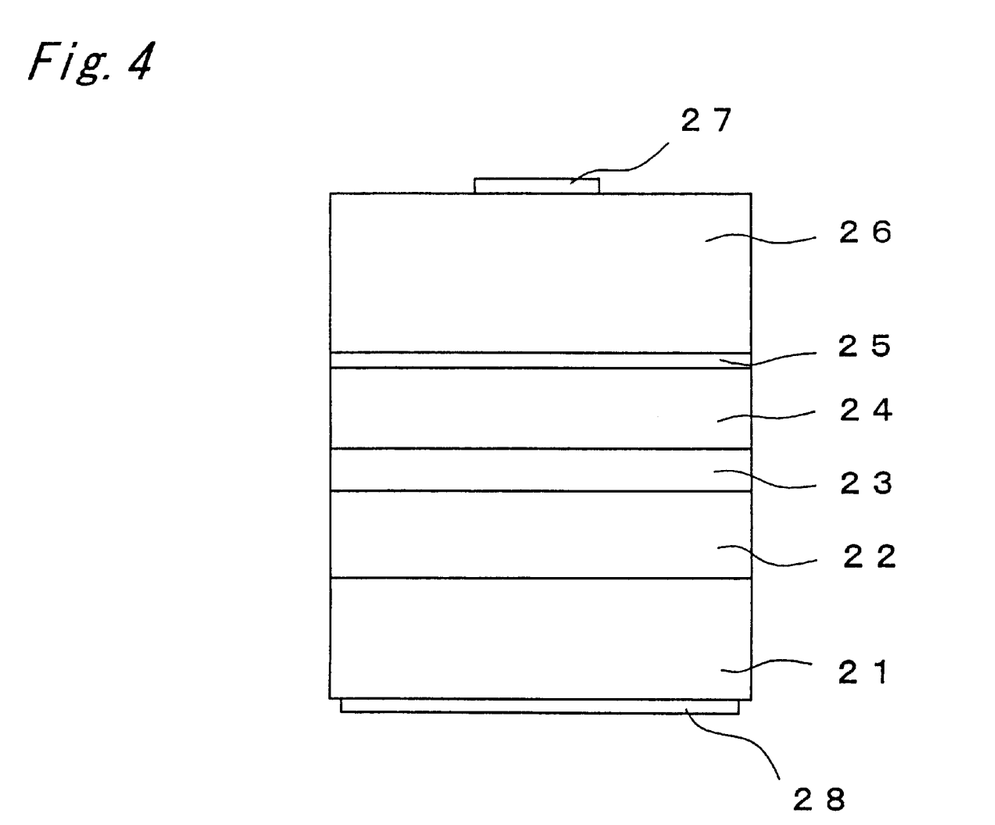
FIG. 4 is a cross sectional view showing a structure of an LED different from the one shown in FIG. 1.

FIG. 4 is a cross sectional view showing a structure of an LED as a semiconductor light emitting device according to the second embodiment. This LED is obtained by successively growing an n-type $(Al_xGa_{1-x})_{0.51}In_{0.49}P$ ($0 \leq x \leq 1$) lower clad layer 22 (for example, x=1.0, Si carrier density: $5 \times 10^{17}$ cm$^{-3}$, thickness: 1.0 μm), an $(Al_xGa_{1-x})_{0.51}In_{0.49}P$ ($0 \leq x \leq 1$) active layer 23 (for example, x=0.3, thickness: 0.5 μm) and a p-type $(Al_xGa_{1-x})_{0.51}In_{0.49}P$ ($0 \leq x \leq 1$) upper clad layer 24 (for example, x=1.0, Zn carrier density; $5 \times 10^{17}$ cm$^{-3}$, thickness: 1.0 μm) on an n-type GaAs substrate 21 at a growth rate of about 1–2.5 μm/h by the MOCVD method. Further, on top of these layers, a p-type $(Al_xGa_{1-x})_yIn_{1-y}P$ ($0 \leq x \leq 1$, $0 \leq y \leq 1$) intermediate layer 25 (for example, x=0.4, y=0.82 (the lattice matching rate $\Delta a/a$ with GaAs is about −2.3%), Zn carrier density: $1 \times 10^{18}$ cm$^{-3}$, thickness: 0.1 μm) and a p-type $(Al_xGa_{1-x})_yIn_{1-y}P$ ($0 \leq x \leq 1$, $0 \leq y \leq 1$) current diffusion layer 26 (for example, x=0.0, y=1.0, Zn carrier density: $3 \times 10^{18}$ cm$^{-3}$, thickness: 7.0 μm) are successively grown. It is noted that the above layers were grown at a growth temperature of about 730° C. Subsequently, a p-type electrode 27 (for example, Au—Zn) and an n-type electrode 28 (for example, Au—Ge) are formed by deposition. The p-type electrode 27 is processed, for example, into a circular shape. Thus, this LED is completed.

The absolute value of the lattice matching rate $\Delta a/a$ of the active layer 23, the lower clad layer 22 and the upper clad layer 24 with GaAs is 0.25% or lower. The absolute value of the lattice matching rate $\Delta a/a$ of the current diffusion layer 26 with GaP is 0.25% or lower.

In this embodiment, an experiment was performed in advance to obtain the relationship between the operating voltage when the operating current of the LED is 20 mA and the lattice matching rate $\Delta a/a$ of the intermediate layer with GaAs. In this experiment, the lattice matching rate $\Delta a/a$ of the intermediate layer was controlled by changing the flow rate of TMGa, TMAl and TMIn, which are materials of Ga, Al and In, when the LED is fabricated by the above method. For each of lattice matching rates $\Delta a/a$ of the intermediate layers, the operating voltage of the LED was measured. The result is shown in FIG. 5.

Figure 5:
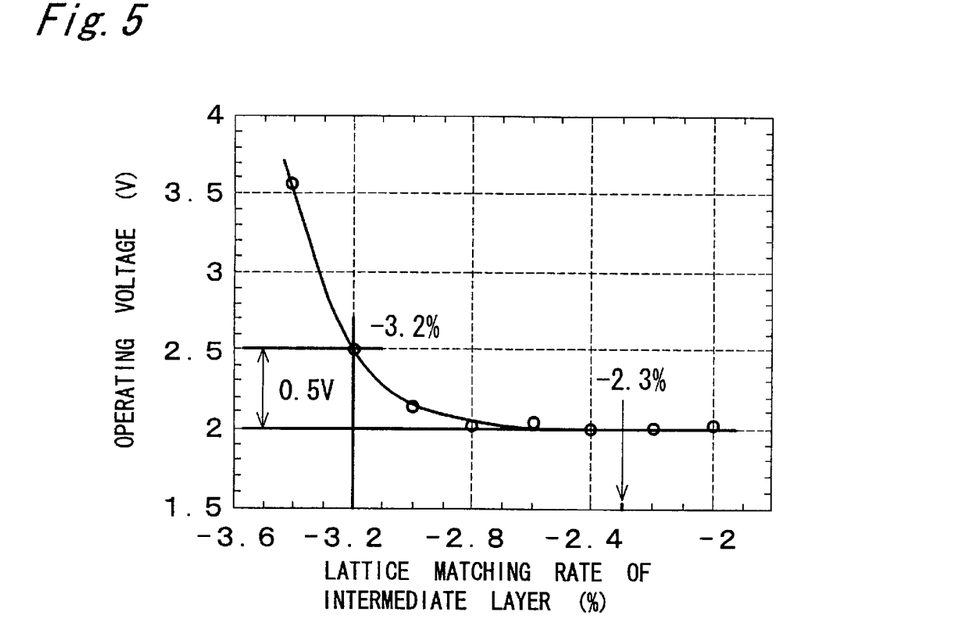
FIG. 5 shows the relationship between the lattice matching rate Δa/a of an intermediate layer in FIG. 4 with GaAs and an operating voltage.

As shown in FIG. 5, the operating voltage increase is 0.5 V or lower in a range where the value of the lattice matching rate $\Delta a/a$ of the intermediate layer is −3.2% or higher.

In this embodiment, based on the experimental results, the value of the lattice matching rate $\Delta a/a$ of the p-type $(Al_xGa_{1-x})_yIn_{1-y}P$ intermediate layer 25 is set to be −2.3%, which is in the range of −3.2% or higher. Therefore, unlike a conventional LED where the value of lattice matching rate $\Delta a/a$ of the intermediate layer is not considered, the operating voltage increases at the upper clad layer 24 interface and at the current diffusion layer 26 interface in the intermediate layer 25 can be suppressed to 0.5 V or lower and thereby operating voltage of the LED can be reduced. As a result, an LED with low power consumption can be fabricated.

Third Embodiment

Figure 6:
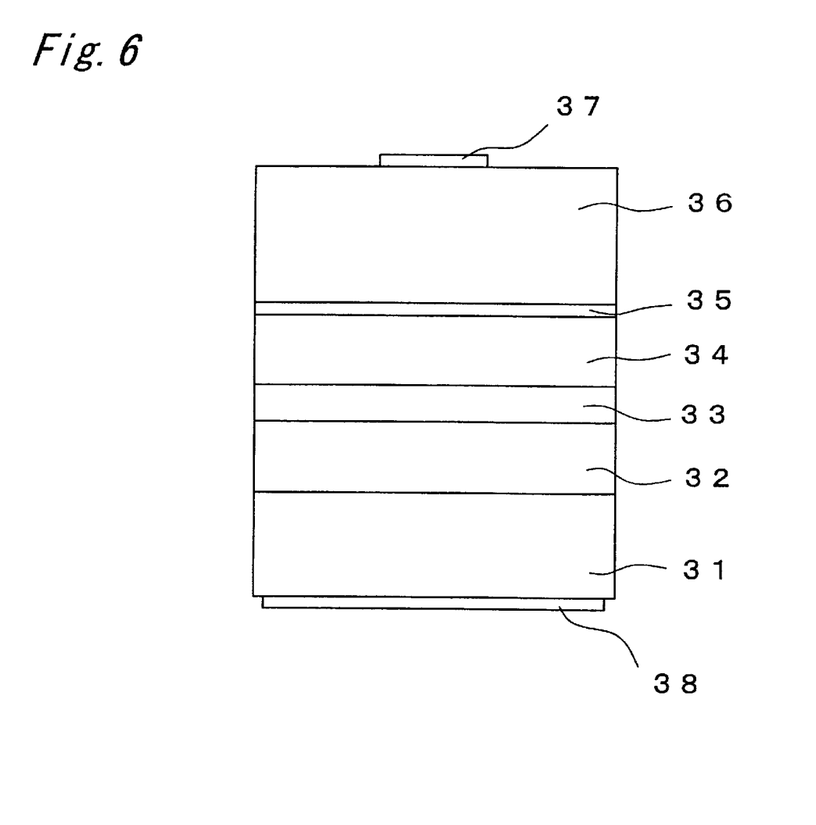
FIG. 6 is a cross sectional view showing a structure of an LED different from the ones shown in FIGS. 1 and 4.

FIG. 6 is a cross sectional view showing a structure of an LED as a semiconductor light emitting device according to the third embodiment. This LED is obtained by successively growing an n-type $(Al_xGa_{1-x})_{0.51}In_{0.49}P$ ($0 \leq x \leq 1$) lower clad layer 32 (for example, x=1.0, Si carrier density: $5 \times 10^{17}$ cm$^{-3}$, thickness: 1.0 μm), an $(Al_xGa_{1-x})_{0.51}In_{0.49}P$ ($0 \leq x \leq 1$) active layer 33 (for example, x=0.3, thickness: 0.5 μm) and a p-type $(Al_xGa_{1-x})_{0.51}In_{0.49}P$ ($0 \leq x \leq 1$) upper clad layer 34 (for example, x=1.0, Zn carrier density: $5 \times 10^{17}$ cm$^{-3}$, thickness: 1.0 μm) on an n-type GaAs substrate 31 at a growth rate of about 1–2.5 μm/h by the MOCVD method. Further, on top of these layers, a p-type $(Al_xGa_{1-x})_yIn_{1-y}P$ ($0 \leq x \leq 1$, $0 \leq y \leq 1$) intermediate layer 35 (for example, x=0.4, y=0.9 (the lattice matching rate $\Delta a/a$ with GaAs is about −2.8%), Zn carrier density: $1 \times 10^{18}$ cm$^{-3}$, thickness: 0.1 μm) and a p-type $(Al_xGa_{1-x})_yIn_{1-y}P$ ($0 \leq x \leq 1$, $0 \leq y \leq 1$) current diffusion layer 36 (for example, x=0.0, y=1.0, Zn carrier density: $3 \times 10^{18}$ cm$^{-3}$, thickness: 7.0 μm) are successively grown. It is noted that the above layers were grown at a growth temperature of about 730° C. Subsequently, a p-type electrode 37 (for example, Au—Zn) and an n-type electrode 38 (for example, Au—Ge) are formed by deposition. The p-type electrode 37 is processed, for example, into a circular shape. Thus, this LED is completed.

The absolute value of the lattice matching rate $\Delta a/a$ of the active layer 33, the lower clad layer 32 and the upper clad layer 34 with GaAs is 0.25% or lower. The absolute value of the lattice matching rate $\Delta a/a$ in the current diffusion layer 36 with GaP is 0.25% or lower.

Figure 7:
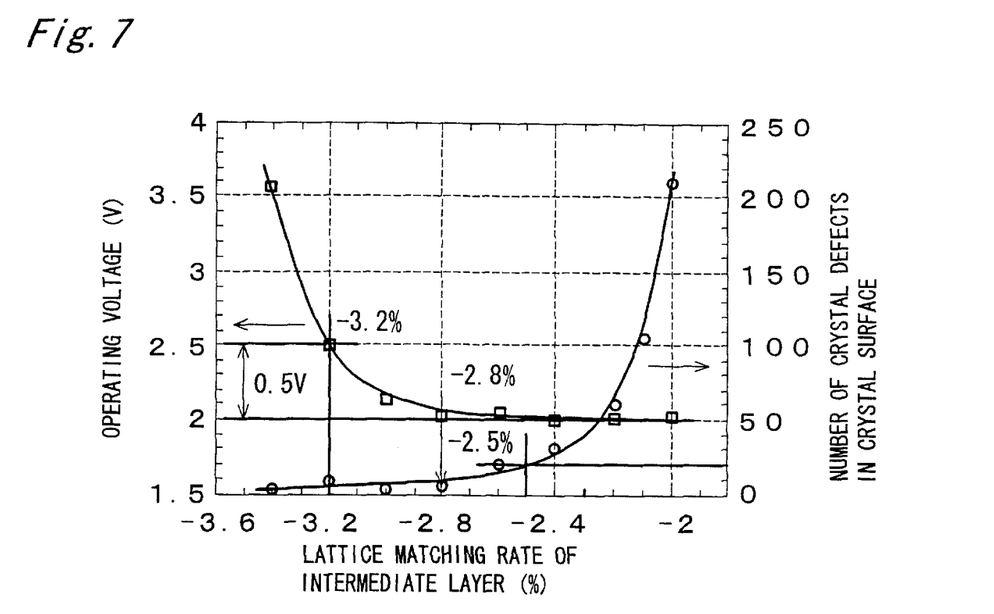
FIG. 7 shows the relationship among the lattice matching rate Δa/a of an intermediate layer in FIG. 6 with GaAs and the number of crystal defects in a crystal surface and an operating voltage.

In this embodiment, the experiments results before the first and second embodiments are considered. FIG. 7 is a graph showing both the experimental results before the first and second embodiments.

As shown in FIG. 7, the operating voltage increase when the operating current of the LED is 20 mA can be suppressed to 0.5 V or lower when the value of the lattice matching rate $\Delta a/a$ of the intermediate layer with GaAs is set to be between −3.2% and −2.5% inclusive. Further, the number of the crystal defects observed in the crystal surface can be reduced to 20 or less per one LED.

In this embodiment, based on the aforementioned experimental results, the value of the lattice matching rate $\Delta a/a$ of the p-type $(Al_xGa_{1-x})_yIn_{1-y}P$ intermediate layer 35 is set to be −2.8%, which is in the range between −3.2% and −2.5% inclusive. Therefore, the number of crystal defects observed in the crystal surface can be made lower than that in a conventional LED where the value of lattice matching rate $\Delta a/a$ of the intermediate layer is not considered. As a result, adhesion of the p-type electrode 37 formed on the p-type $(Al_xGa_{1-x})_yIn_{1-y}P$ current diffusion layer 36 is improved and thereby the yield can be enhanced. Further, operating voltage of the LED can be reduced and thereby an LED with low power consumption can be fabricated.

Fourth Embodiment

Figure 8:
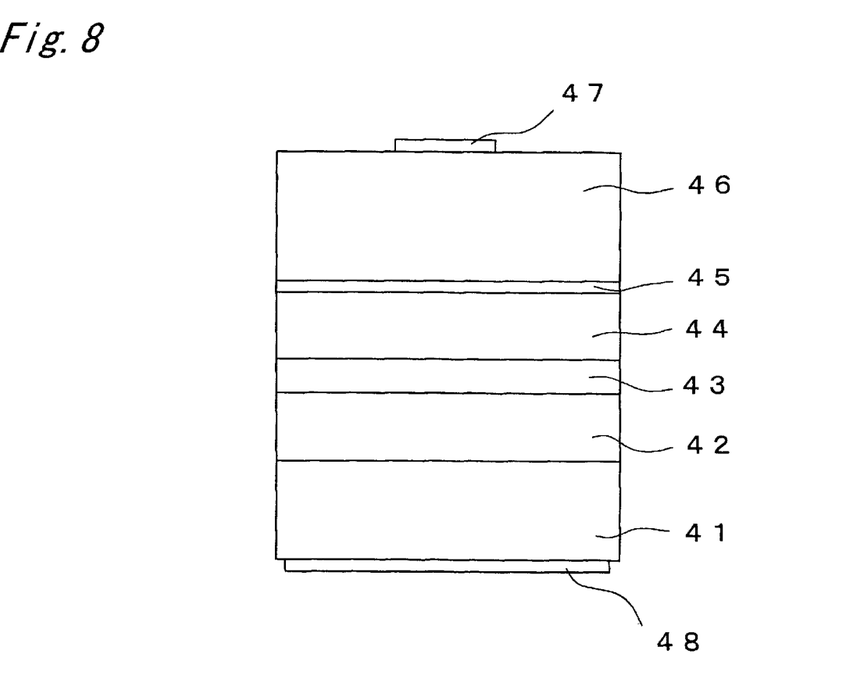
FIG. 8 is a cross sectional view showing a structure of an LED different from the ones shown in FIGS. 1, 4 and 6.

FIG. 8 is a cross sectional view showing a structure of an LED as a semiconductor light emitting device according to the fourth embodiment. This LED is obtained by successively growing an n-type $(Al_xGa_{1-x})_{0.51}In_{0.49}P$ ($0 \leq x \leq 1$) lower clad layer 42 (for example, x=1.0, Si carrier density: $5 \times 10^{17}$ cm$^{-3}$, thickness: 1.0 μm), an $(Al_xGa_{1-x})_{0.51}In_{0.49}P$ ($0 \leq x \leq 1$) active layer 43 (for example, x=0.3, thickness: 0.5 μm) and a p-type $(Al_xGa_{1-x})_{0.51}In_{0.49}P$ ($0 \leq x \leq 1$) upper clad layer 44 (for example, x=1.0, Zn carrier density: $5 \times 10^{17}$ cm$^{-3}$, thickness: 1.0 μm) on an n-type GaAs substrate 41 at a growth rate of about 1–2.5 μm/h by the MOCVD method. Further, on top of these layers, a p-type $Al_xGa_{1-x}As_yP_{1-y}$ ($0 \leq x \leq 1$, $0 \leq y \leq 1$) intermediate layer 45 (for example, x=0.2, y=0.04 (the lattice matching rate $\Delta a/a$ with GaAs is about −3.4%), Zn carrier density: $1\times10^{18}$ cm$^{-3}$, thickness: 0.1 μm) and a p-type $(Al_xGa_{1-x})_yIn_{1-y}P$ ($0\leq x\leq 1$) current diffusion layer 46 (for example, x =0.0, y=1.0, Zn carrier density: $3\times10^{18}$ cm$^{-3}$, thickness: 7.0 μm) are successively grown. It is noted that the above layers were grown at a growth temperature of about 730° C. Subsequently, a p-type electrode 47 (for example, Au—Zn) and an n-type electrode 48 (for example, Au—Ge) are formed by deposition. The p-type electrode 47 is processed, for example, into a circular shape. Thus, this LED is completed.

The absolute value of the lattice matching rate $\Delta a/a$ of the active layer 43, the lower clad layer 42 and the upper clad layer 44 with GaAs is 0.25% or lower. The absolute value of the lattice matching rate $\Delta a/a$ of the current diffusion layer 46 with GaP is 0.25% or lower.

In this embodiment, an experiment was performed in advance to obtain the relationship between the number of the crystal defects observed in the crystal surface and the lattice matching rate $\Delta a/a$ of the intermediate layer with GaAs. In this experiment, the lattice matching rate $\Delta a/a$ of the intermediate layer was controlled by changing the flow rate of TMGa, TMAl, AsH$_3$ and PH$_3$, which are materials of Ga, Al, As and P, when the LED was fabricated by the above method. For each of lattice matching rates $\Delta a/a$ of the intermediate layers, the number of crystal defects observed in the crystal surface was measured after crystal growth. The result is shown in FIG. 9.

Figure 9:
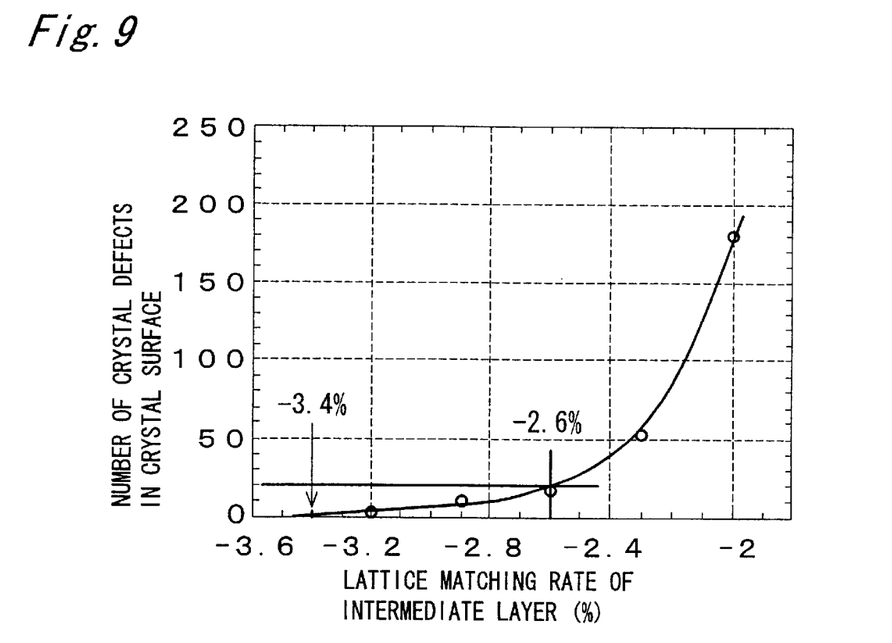
FIG. 9 shows the relationship between the lattice matching rate Δa/a of an intermediate layer in FIG. 8 with GaAs and the number of crystal defects in a crystal surface.

As shown in FIG. 9, the number of crystal defects observed in the crystal surface is 20 or less per one LED in a range where the value of the lattice matching rate $\Delta a/a$ of the intermediate layer is −2.6% or lower.

In this embodiment, based on the experimental results, the value of the lattice matching rate $\Delta a/a$ of the p-type $Al_xGa_{1-x}As_yP_{1-y}$ intermediate layer 45 is −3.4%, which is in the range of −2.6% or lower. Therefore, the number of crystal defects observed in the crystal surface can be made lower than that in a conventional LED in which the value of lattice matching rate $\Delta a/a$ of the intermediate layer is not considered. As a result, adhesion of the p-type electrode 47 formed on the p-type $(Al_xGa_{1-x})_yIn_{1-y}P$ current diffusion layer 46 is improved and thereby the yield rate can be improved.

Fifth Embodiment

Figure 10:
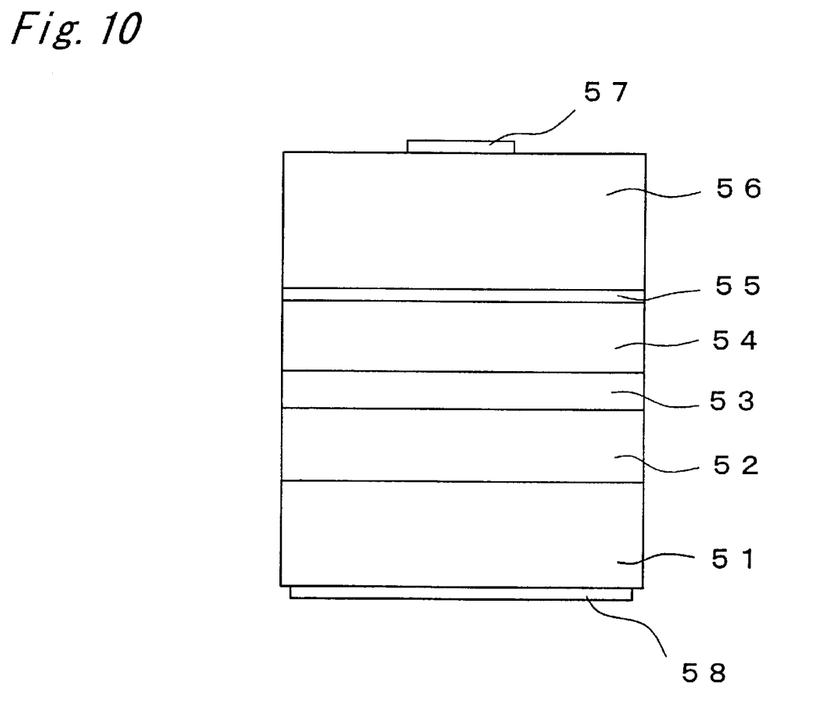
FIG. 10 is a cross sectional view showing a structure of an LED different from the ones shown in FIGS. 1, 4, 6 and 8.

FIG. 10 is a cross sectional view showing a structure of an LED as a semiconductor light emitting device according to the fifth embodiment. This LED is obtained by successively growing an n-type $(Al_xGa_{1-x})_{0.51}In_{0.49}P$ ($0\leq x\leq 1$) lower clad layer 52 (for example, x=1.0, Si carrier density: $5\times10^{17}$ cm$^{-3}$, thickness: 1.0 μm), an $(Al_xGa_{1-x})_{0.51}In_{0.49}P$ ($0\leq x\leq 1$) active layer 53 (for example, x=0.3, thickness: 0.5 μm) and a p-type $(Al_xGa_{1-x})_{0.51}In_{0.49}P$ ($0\leq x\leq 1$) upper clad layer 54 (for example, x=1.0, Zn carrier density: $5\times10^{17}$ cm$^{-3}$, thickness: 1.0 μm) on an n-type GaAs substrate 51 at a growth rate of about 1–2.5 μm/h by the MOCVD method. Further, on top of these layers, a p-type $Al_xGa_{1-x}As_yP_{1-y}$ ($0\leq x\leq 1$, $0\leq y\leq 1$) intermediate layer 55 (for example, x=0.4, y=0.38 (the lattice matching rate $\Delta a/a$ with GaAs is about −2.2%), Zn carrier density $1\times10^{18}$ cm$^{-3}$, thickness: 0.1 μm) and a p-type $(Al_xGa_{1-x})_yIn_{1-y}P$ ($0\leq x\leq 1$, $0\leq y\leq 1$) current diffusion layer 56 (for example, x=0.0, y=1.0, Zn carrier density: $3\times10^{18}$ cm$^{-3}$, thickness: 7.0 μm) are successively grown. It is noted that the above layers were grown at a growth temperature of about 730° C. Subsequently, a p-type electrode 57 (for example, Au—Zn) and an n-type electrode 58 (for example, Au—Ge) are formed by deposition. The p-type electrode 57 is processed, for example, into a circular shape. Thus, this LED is completed.

The absolute value of the lattice matching rate $\Delta a/a$ of the active layer 53, the lower clad layer 52 and the upper clad layer 54 with GaAs is 0.25% or lower. The absolute value of the lattice matching rate $\Delta a/a$ of the current diffusion layer 56 with GaP is 0.25% or lower.

In this embodiment, an experiment was performed in advance to obtain the relationship between the operating voltage when the operating current of the LED is 20 mA and the lattice matching rate $\Delta a/a$ of the intermediate layer with GaAs. In this experiment, the lattice matching rate $\Delta a/a$ of the intermediate layer was controlled by changing the flow rate of TMGa, TMAl, AsH$_3$ and PH$_3$, which are materials of Ga, Al, As and P, when the LED was fabricated by the above method. For each of lattice matching rates $\Delta a/a$ of the intermediate layers, the operating voltage of the LED was measured. The result is shown in FIG. 11.

Figure 11:
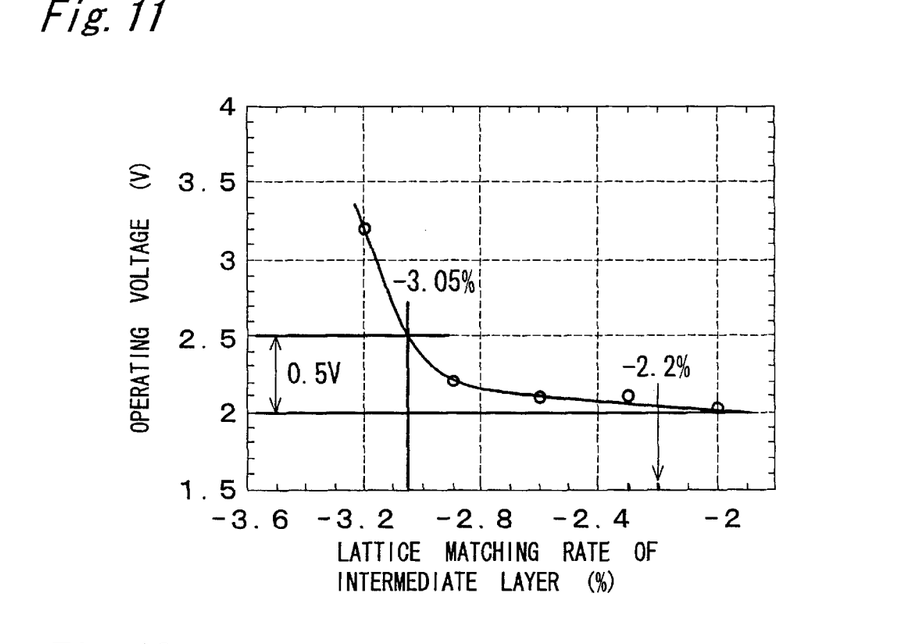
FIG. 11 shows the relationship between the lattice matching rate Δa/a of an intermediate layer in FIG. 10 with GaAs and an operating voltage.

As shown in FIG. 11, the operating voltage increase is 0.5 V or lower in a range where the value of the lattice matching rate $\Delta a/a$ of the intermediate layer is −3.05% or higher.

In this embodiment, based on the experimental results, the value of the lattice matching rate $\Delta a/a$ of the p-type $Al_xGa_{1-x}As_yP_{1-y}$ ($0\leq x\leq 1$, $0\leq y\leq 1$) intermediate layer 55 is −2.2%, which is in the range of −3.05% or higher. Therefore, unlike a conventional LED in which the value of the lattice matching rate $\Delta a/a$ of the intermediate layer is not considered, the operating voltage increases at the upper clad layer 54 interface and at the current diffusion layer 56 interface in the intermediate layer 55 can be suppressed to 0.5 V or lower and thereby operating voltage of the LED can be reduced. As a result, an LED with low power consumption can be fabricated.

Sixth Embodiment

Figure 12:
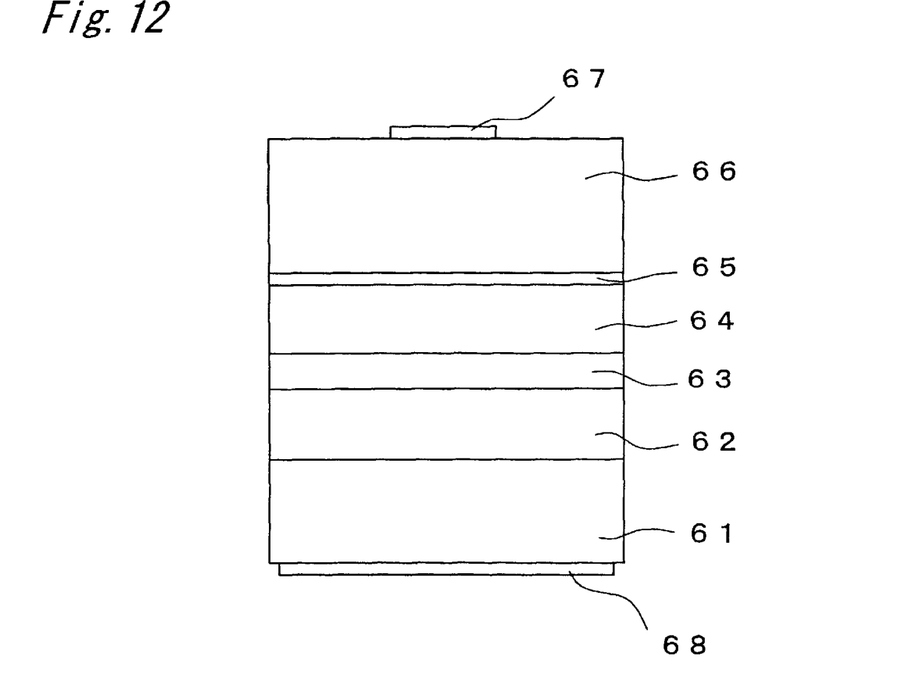
FIG. 12 is a cross sectional view showing a structure of an LED different from the ones shown in FIGS. 1, 4, 6, 8 and 10.

FIG. 12 is a cross sectional view showing a structure of an LED as a semiconductor light emitting device according to the sixth embodiment. This LED is obtained by successively growing an n-type $(Al_xGa_{1-x})_{0.51}In_{0.49}P$ ($0\leq x\leq 1$) lower clad layer 62 (for example, x=1.0, Si carrier density: $5\times10^{17}$ cm$^{-3}$, thickness: 1.0 μm), an $(Al_xGa_{1-x})_{0.51}In_{0.49}P$ ($0\leq x\leq 1$) active layer 63 (for example, x=0.3, thickness; 0.5 μm) and a p-type $(Al_xGa_{1-x})_{0.51}In_{0.49}P$ ($0\leq x\leq 1$) upper clad layer 64 (for example, x=1.0, Zn carrier density: $5\times10^{17}$ cm$^{-3}$, thickness: 1.0 μm) on an n-type GaAs substrate 61 at a growth rate of about 1–2.5 μm/h by the MOCVD method. Further, on top of these layers, a p-type $Al_xGa_{1-x}As_yP_{1-y}$ ($0\leq x\leq 1$, $0\leq y\leq 1$) intermediate layer 65 (for example, x=0.3, y=0.2 (the lattice matching rate $\Delta a/a$ with GaAs is about −2.82%), Zn carrier density: $1\times10^{18}$ cm$^{-3}$, thickness; 0.1 μm) and a p-type $(Al_xGa_{1-x})_yIn_{1-y}P$ ($0\leq x\leq 1$, $0\leq y\leq 1$) current diffusion layer 66 (for example, x=0.0, y=1.0, Zn carrier density: $3\times10^{18}$ cm$^{-3}$, thickness: 7.0 μm) are successively grown. It is noted that the above layers were grown at a growth temperature of about 730° C. Subsequently, a p-type electrode 67 (for example, Au—Zn) and an n-type electrode 68 (for example, Au—Ge) are formed by deposition. The p-type electrode 67 is processed, for example, into a circular shape. Thus, this LED is completed.

The absolute value of the lattice matching rate $\Delta a/a$ of the active layer 63, the lower clad layer 62 and the upper clad layer 64 with GaAs is 0.25% or lower. The absolute value of the lattice matching rate $\Delta a/a$ of the current diffusion layer 66 with GaP is 0.25% or lower.

Figure 13:
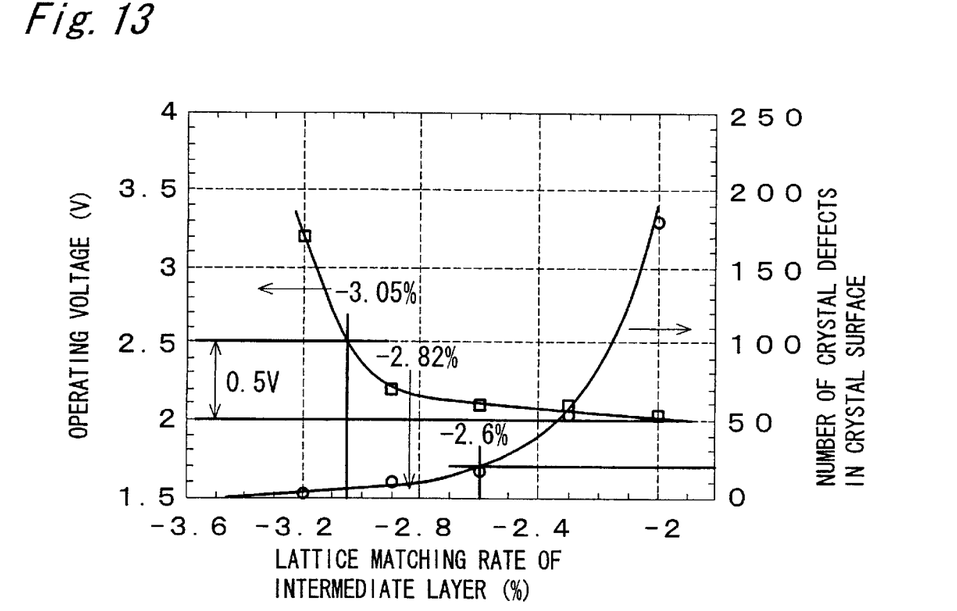
FIG. 13 shows the relationship among the lattice matching rate Δa/a of an intermediate layer in FIG. 12 with GaAs and the number of crystal defects in a crystal surface and an operating voltage.

In this embodiment, the experimental results before the fourth and the fifth embodiments are considered. FIG. 13 is a graph showing both the experimental results before the fourth and fifth embodiments.

As shown in FIG. 13, the operating voltage increase when the operating current of the LED is 20 mA can be suppressed to 0.5 V or lower when the value of the lattice matching rate $\Delta a/a$ of the intermediate layer with GaAs is set to be between $-3.05\%$ and $-2.6\%$ inclusive. Further, the number of the crystal defects observed in the crystal surface can be reduced to 20 or less per one LED.

In this embodiment, based on the aforementioned experimental results, the value of the lattice matching rate $\Delta a/a$ of the p-type $Al_xGa_{1-x}As_yP_{1-y}$ intermediate layer 65 is set to be $-2.82\%$, which is in the range between 3.05% and $-2.6\%$ inclusive. Therefore, the number of crystal defects observed in the crystal surface can be made lower than that in a conventional LED where the value of lattice matching rate $\Delta a/a$ of the intermediate layer is not considered. As a result, adhesion of the p-type electrode 67 formed on the p-type $(Al_xGa_{1-x})_yIn_{1-y}P$ current diffusion layer 66 is improved and thereby the yield can be improved. Further, operating voltage of the LED can be reduced and thereby an LED with low power consumption can be fabricated.

Seventh Embodiment

Figure 14:
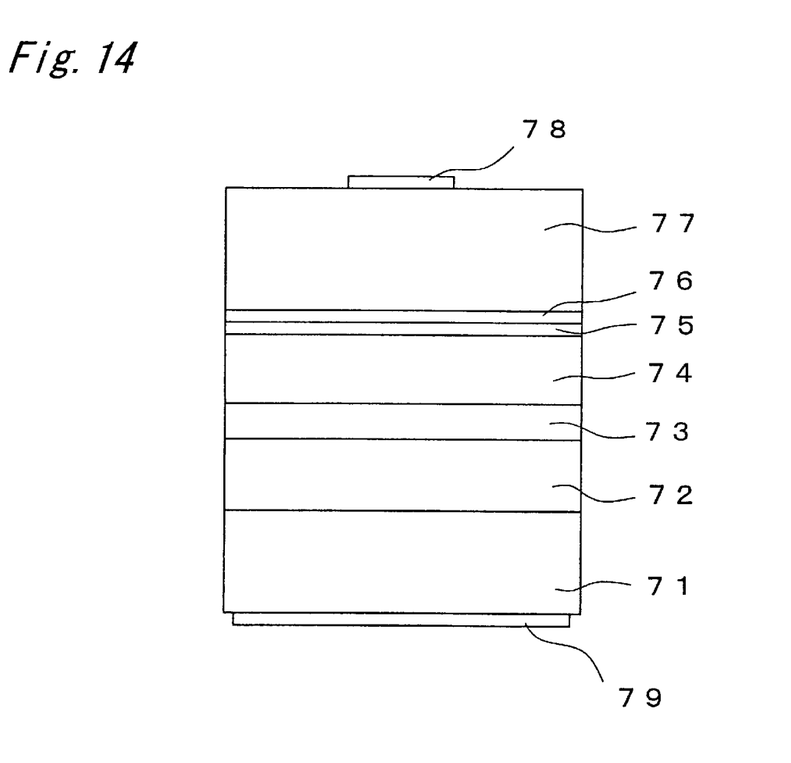
FIG. 14 is a cross sectional view showing a structure of an LED different from the ones shown in FIGS. 1, 4, 6, 8, 10 and 12.

FIG. 14 is a cross sectional view showing a structure of an LED as a semiconductor light emitting device according to the seventh embodiment. This LED is obtained by successively growing an n-type $(Al_xGa_{1-x})_{0.51}In_{0.49}P$ ($0 \leq x \leq 1$) lower clad layer 72 (for example, x=1.0, Si carrier density; $5 \times 10^{17}$ cm$^{-3}$, thickness: 1.0 µm), an $(Al_xGa_{1-x})_{0.51}In_{0.49}P$ ($0 \leq x \leq 1$) active layer 73 (for example, x=0.3, thickness; 0.5 µm) and a p-type $(Al_xGa_{1-x})_{0.51}In_{0.49}P$ ($0 \leq x \leq 1$) upper clad layer 74 (for example, x=1.0, Zn carrier density: $5 \times 10^{17}$ cm$^{-3}$, thickness: 1.0 µm) on an n-type GaAs substrate 71 at a growth rate of about 1–2.5 µm/h by the MOCVD method. Further, on top of these layers, a p-type $(Al_xGa_{1-x})_yIn_{1-y}P$ ($0 \leq x \leq 1$, $0 \leq y \leq 1$) first intermediate layer 75 (for example, x=0.71, y=0.87 (the lattice matching rate $\Delta a/a$ with GaAs is about $-2.6\%$), a p-type $(Al_xGa_{1-x})_yIn_{1-y}P$ ($0 \leq x \leq 1$, $0 \leq y \leq 1$) second intermediate layer 76 (for example, x=0.2, y=0.94 (the lattice matching rate $\Delta a/a$ with GaAs is about $-3.1\%$), Zn carrier density: $1 \times 10^{18}$ cm$^{-3}$, thickness: 0.1 µm) and a p-type $(Al_xGa_{1-x})_yIn_{1-y}P$ ($0 \leq x \leq 1$, $0 \leq y \leq 1$) current diffusion layer 77 (for example, x=0.0, y=1.0, Zn carrier density: $3 \times 10_{18}$ cm$^{-3}$, thickness: 7.0 µm) are successively grown. It is noted that the above layers were grown at a growth temperature of about 730° C. Subsequently, a p-type electrode 78 (for example, Au—Zn) and an n-type electrode 79 (for example, Au—Ge) are formed by deposition. The p-type electrode 78 is processed, for example, into a circular shape. Thus this LED is completed.

The absolute value of the lattice matching rate $\Delta a/a$ of the active layer 73, the lower clad layer 72 and the upper clad layer 74 with GaAs is 0.25% or lower. The absolute value of the lattice matching rate $\Delta a/a$ of the current diffusion layer 77 with GaP is 0.25% or lower.

Figure 15:
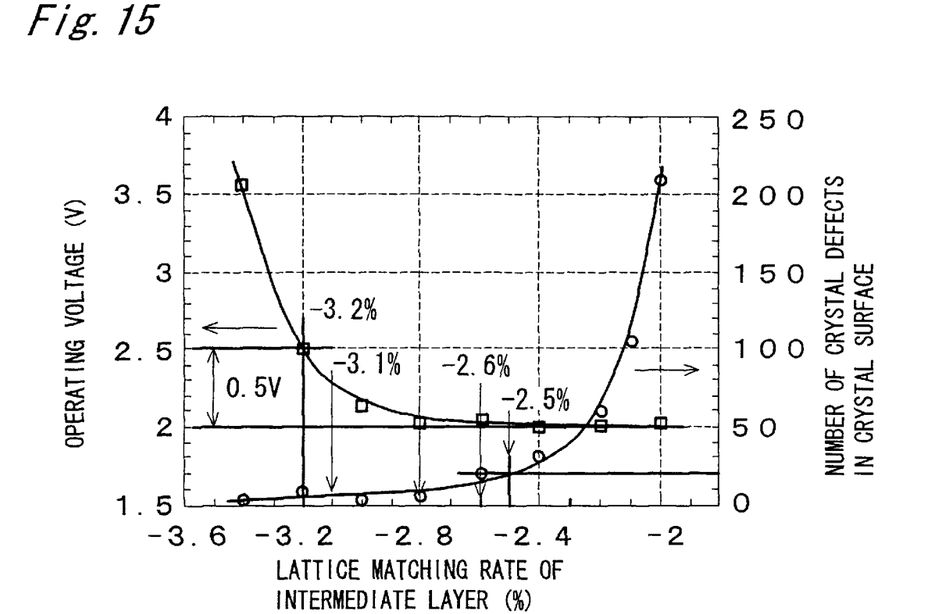
FIG. 15 shows the relationship of the lattice matching rate Δa/a of an intermediate layer in FIG. 14 with GaAs and the number of crystal defects in a crystal surface and an operating voltage.

In this embodiment, the intermediate layer is composed of plural layers in consideration to the experimental results before the first and second embodiments. FIG. 15 is a graph showing both the experimental results before the first and second embodiments.

As shown in FIG. 15, when the value of the lattice matching rate $\Delta a/a$ of the intermediate layer with GaAs is set to be between $-3.2\%$ and $-2.5\%$ inclusive, the operating voltage increase when the operating current of the LED is 20 mA can be suppressed to 0.5 V or lower. Further, the number of the crystal defects observed in the crystal surface can be reduced to 20 or less per one LED.

In this embodiment, based on the aforementioned experimental results, the values of the lattice matching rate $\Delta a/a$ of the first intermediate layer 75 and the second intermediate layer 76 are set to be $-2.6\%$ and $-3.1\%$, respectively, which are in the range between $-3.2\%$ and 2.5% inclusive. Therefore, the number of crystal defects observed in the crystal surface can be made lower than that in a conventional LED in which the value of lattice matching rate $\Delta a/a$ of the intermediate layer is not considered. As a result, adhesion of the p-type electrode 78 formed on the p-type $(Al_xGa_{1-x})_yIn_{1-y}P$ current diffusion layer 77 is improved and thereby the yield can be raised. Further, the operating voltage of the LED can be reduced and thereby an LED with low power consumption can be fabricated. Further, since the intermediate layer is comprised of a plurality of layers 74, 76 in this embodiment, "notches" occurring at the interface between the first intermediate layer 75 and the upper clad layer 74 and at the interface between the second intermediate layer 76 and the current diffusion layer 77 can be lowered. Therefore, the operating voltage can be further reduced.

In each of the above embodiments, the current diffusion layer 16, 26, 36, 46, 56, 66, 77 is constituted by AlGaInP compound semiconductor of which the absolute value of the lattice matching rate $\Delta a/a$ with GaP is 0.25% or lower. However, the present invention is not limited to this composition, but the current diffusion layer may be constituted by GaP compound semiconductor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light emitting device comprising:
   a compound semiconductor substrate comprising GaAs;
   a laminated structure provided on the compound semiconductor substrate and including at least an active layer for emitting light, a first clad layer and a second clad layer sandwiching the active layer from both sides thereof;
   an intermediate layer formed on the laminated structure, the intermediate layer comprising AlGaInP;
   a current diffusion layer formed on the intermediate layer;
   wherein a lattice matching rate of the intermediate layer comprising AlGaInP with GaAs is $-2.5\%$ or lower in order to improve adhesion of an electrode.

2. The semiconductor light emitting device according to claim 1, wherein
   a value of a lattice matching rate $\Delta a/a$ of the intermediate layer with the compound semiconductor substrate is set such that the number of crystal defects observed in a crystal surface is 20 or less after crystal growth finishes.

3. The semiconductor light emitting device according to claim 1, wherein
   a value of a lattice matching rate $\Delta a/a$ of the intermediate layer with the compound semiconductor substrate is set such that an operating voltage increase when a driving current is 20 mA is 0.5 V or lower at interfaces in the intermediate layer.

4. The semiconductor light emitting device according to claim 1, wherein
   a value of a lattice matching rate $\Delta a/a$ of the intermediate layer with the compound semiconductor substrate is set such that the number of crystal defects observed in a crystal surface is 20 or less after crystal growth finishes and that an operating voltage increase when a driving current is 20 mA is 0.5 V or lower at interfaces in the intermediate layer.

5. The semiconductor light emitting device according to claim 1, wherein the compound semiconductor substrate is constituted by GaAs, the active layer, the first clad layer and the second clad layer are constituted by AlGaInP compound semiconductor of which an absolute value of a lattice matching rate Δa/a with GaAs is 0.25% or lower, the current diffusion layer is constituted by AlGaInP compound semiconductor or GaP compound semiconductor of which an absolute value of a lattice matching rate Δa/a with GaP is 0.25% or lower, and the intermediate layer is constituted by AlGaInP compound semiconductor whose lattice matching rate Δa/a with GaAs is −2.5% or lower.

6. The semiconductor light emitting device according to claim 2, wherein the compound semiconductor substrate is constituted by GaAs, the active layer, the first clad layer and the second clad layer is constituted by AlGaInP compound semiconductor which is lattice-matched with GaAs, the current diffusion layer is constituted by AlGaInP compound semiconductor or GaP compound semiconductor, and the intermediate layer is constituted by AlGaInP compound semiconductor.

7. The semiconductor light emitting device according to claim 3, wherein the compound semiconductor substrate is constituted by GaAs, the active layer, the first clad layer and the second clad layer is constituted by AlGaInP compound semiconductor which is lattice-matched with GaAs, the current diffusion layer is constituted by AlGaInP compound semiconductor or GaP compound semiconductor, and the intermediate layer is constituted by AlGaInP compound semiconductor.

8. The semiconductor light emitting device according to claim 4, wherein the compound semiconductor substrate is constituted by GaAs, the active layer, the first clad layer and the second clad layer is constituted by AlGaInP compound semiconductor which is lattice-matched with GaAs, the current diffusion layer is constituted by AlGaInP compound semiconductor or GaP compound semiconductor, and the intermediate layer is constituted by AlGaInP compound semiconductor.

9. The semiconductor light emitting device according to claim 2, wherein the compound semiconductor substrate is constituted by GaAs, the active layer, the first clad layer and the second clad layer is constituted by AlGaInP compound semiconductor which is lattice-matched with GaAs, the current diffusion layer is constituted by AlGaInP compound semiconductor or GaP compound semiconductor, and the intermediate layer is constituted by AlGaAsP compound semiconductor.

10. The semiconductor light emitting device according to claim 3, wherein the compound semiconductor substrate is constituted by GaAs, the active layer, the first clad layer and the second clad layer is constituted by AlGaInP compound semiconductor which is lattice-matched with GaAs, the current diffusion layer is constituted by AlGaInP compound semiconductor or GaP compound semiconductor, and the intermediate layer is constituted by AlGaAsP compound semiconductor.

11. The semiconductor light emitting device according to claim 4, wherein the compound semiconductor substrate is constituted by GaAs, the active layer, the first clad layer and the second clad layer is constituted by AlGaInP compound semiconductor which is lattice-matched with GaAs, the current diffusion layer is constituted by AlGaInP compound semiconductor or GaP compound semiconductor, and the intermediate layer is constituted by AlGaAsP compound semiconductor.

12. The semiconductor light emitting device according to claim 2, wherein the intermediate layer is comprised of a plurality of layers.

13. The semiconductor light emitting device according to claim 3, wherein the intermediate layer is comprised of a plurality of layers.

14. The semiconductor light emitting device according to claim 4, wherein the intermediate layer is comprised of a plurality of layers.

15. The semiconductor light emitting device according to claim 5, wherein the intermediate layer is comprised of a plurality of layers.

16. A semiconductor light emitting device comprising:

a compound semiconductor substrate comprising GaAs;

a laminated structure provided on the compound semiconductor substrate and including at least an active layer for emitting light, a first clad layer and a second clad layer sandwiching the active layer from both sides thereof;

an intermediate layer comprising AlGaInP formed on the laminated structure;

a current diffusion layer formed on the intermediate layer;

wherein a lattice matching rate of the intermediate layer with GaAs is between −3.2% and −2.5% in order to improve adhesion of an electrode and reduce an operating voltage.

17. A semiconductor light emitting device comprising:

a compound semiconductor substrate comprising GaAs;

a laminated structure provided on the compound semiconductor substrate and including at least an active layer for emitting light, a first clad layer and a second clad layer sandwiching the active layer from both sides thereof;

an intermediate layer comprising AlGaInP formed on the laminated structure;

a current diffusion layer formed on the intermediate layer;

wherein a lattice matching rate of the intermediate layer with GaAs is −3.2% or higher in order to reduce operating voltage of the device.

18. The semiconductor light emitting device according to claim 1, wherein the intermediate layer is comprised of a plurality of layers.

19. The semiconductor light emitting device according to claim 1, wherein the intermediate layer is comprised of a plurality of layers.

* * * * *